United States Patent
Lavoie et al.

(10) Patent No.: US 11,480,537 B2
(45) Date of Patent: Oct. 25, 2022

(54) METHODS AND STRUCTURE TO PROBE THE METAL-METAL INTERFACE FOR SUPERCONDUCTING CIRCUITS

(71) Applicant: INTERNATIONAL BUSINESS MACHINES CORPORATION, Armonk, NY (US)

(72) Inventors: Christian Lavoie, Pleasantville, NY (US); Markus Brink, White Plains, NY (US); Benjamin Wymore, Cortlandt Manor, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 16/945,549

(22) Filed: Jul. 31, 2020

(65) Prior Publication Data
US 2022/0034833 A1    Feb. 3, 2022

(51) Int. Cl.
*G01N 27/04*     (2006.01)
*G06N 10/00*     (2022.01)
*H01L 39/08*     (2006.01)

(52) U.S. Cl.
CPC ........... *G01N 27/041* (2013.01); *G06N 10/00* (2019.01); *H01L 39/08* (2013.01)

(58) Field of Classification Search
CPC ....... G01N 27/041; G06N 10/00; H01L 39/08
See application file for complete search history.

(56) References Cited

U.S. PATENT DOCUMENTS

| | | | |
|---|---|---|---|
| 10,199,553 B1 | 2/2019 | Oliver et al. | |
| 2002/0176972 A1* | 11/2002 | Tsai | H01L 22/34 428/200 |
| 2006/0148113 A1* | 7/2006 | Jung | H01L 22/34 438/17 |

FOREIGN PATENT DOCUMENTS

| | | | | |
|---|---|---|---|---|
| DE | 10066319 B4 | 6/2012 | | |
| DE | 102011083489 A1 | * 3/2013 | ........... | H01L 39/143 |
| JP | 63033665 A | * 2/1988 | ............. | G01R 27/02 |
| KR | 20070005321 A | * 1/2007 | ............. | H01L 22/32 |

OTHER PUBLICATIONS

English translation of JP-63033665-A.*
Dvoranová, M., Plecenik, T., Moško, M., Vidiš, M., Gregor, M., Roch, T., . . . & Plecenik, A. (2018). Point contact spectroscopy of superconductors via nanometer scale point contacts formed by resistive switching. AIP Advances, 8 (12), 125217.

(Continued)

*Primary Examiner* — Jay Patidar
(74) *Attorney, Agent, or Firm* — Henry J. Daley; Venable LLP

(57) ABSTRACT

A method of measuring contact resistance at an interface for superconducting circuits is provided. The method includes using a chain structure of superconductors to measure a contact resistance at a contact between contacting superconductor. The method further includes eliminating ohmic resistance from wire lengths in the chain structure by operating below the lowest superconducting transition temperature of all the superconductors in the chain structure. The measurement is dominated by contact resistances of the contacts between contacting superconductors in the chain.

25 Claims, 10 Drawing Sheets

(56) References Cited

OTHER PUBLICATIONS

Sacépé, B., Seidemann, J. et al., "Low-temperature anomaly in disordered superconductors near Bc2 as a vortex-glass property", (2019) Nature physics, 15(1), 48.
McConkey, T., "Extensible Architecture for Superconducting Quantum Computing", (2018).
Grabecki, G., Koiwas, et al., "Contact superconductivity in In—PbTe junctions" (2010) Journal of Applied Physics, 108 (5), 053714.
Strachan, D. R., Sullivan et al., "Probing the limits of superconductivity", (Nov. 2002), In Superconducting and Related Oxides: Physics and Nanoengineering V (vol. 4811, pp. 65-77). International Society for Optics and Photonics.

\* cited by examiner

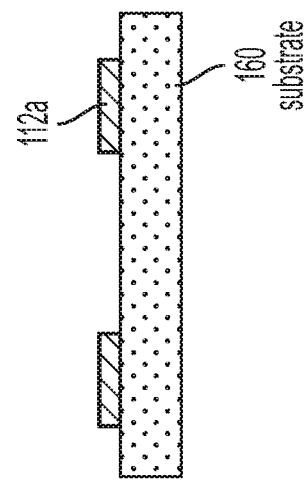
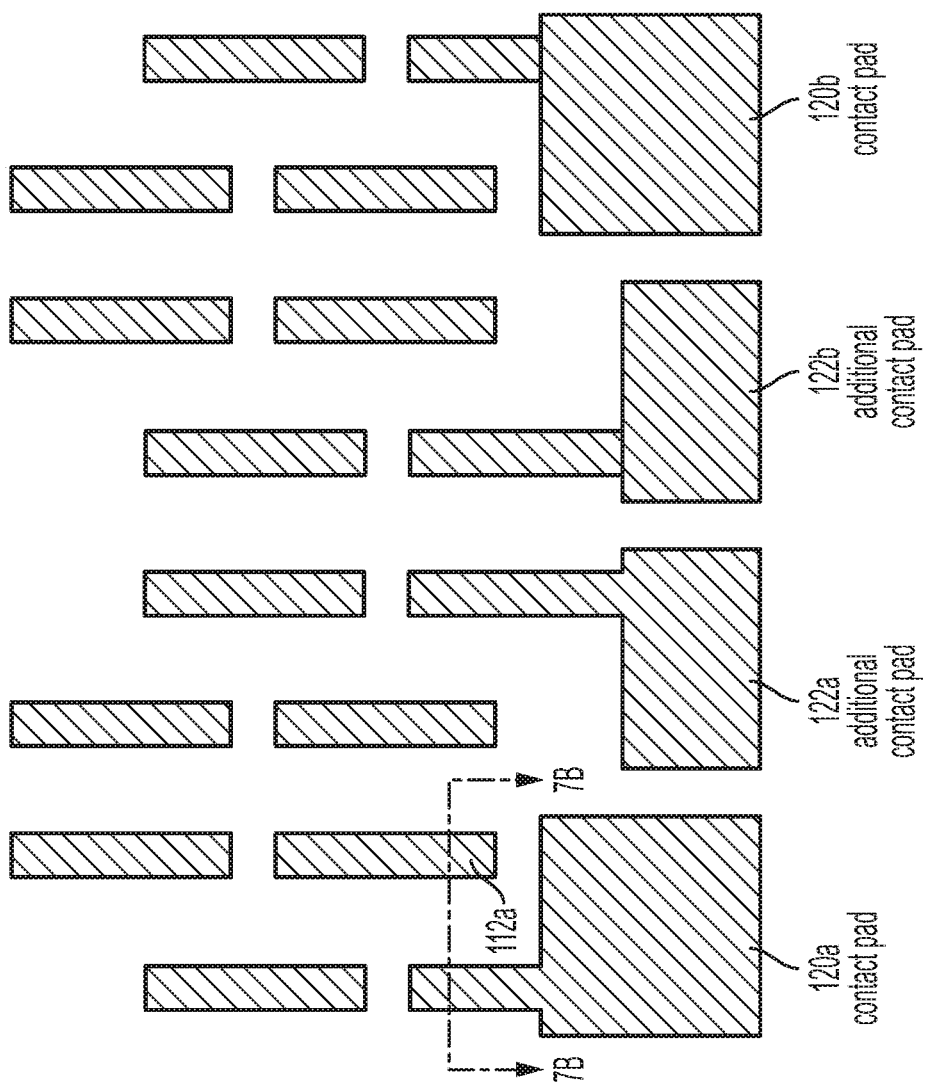

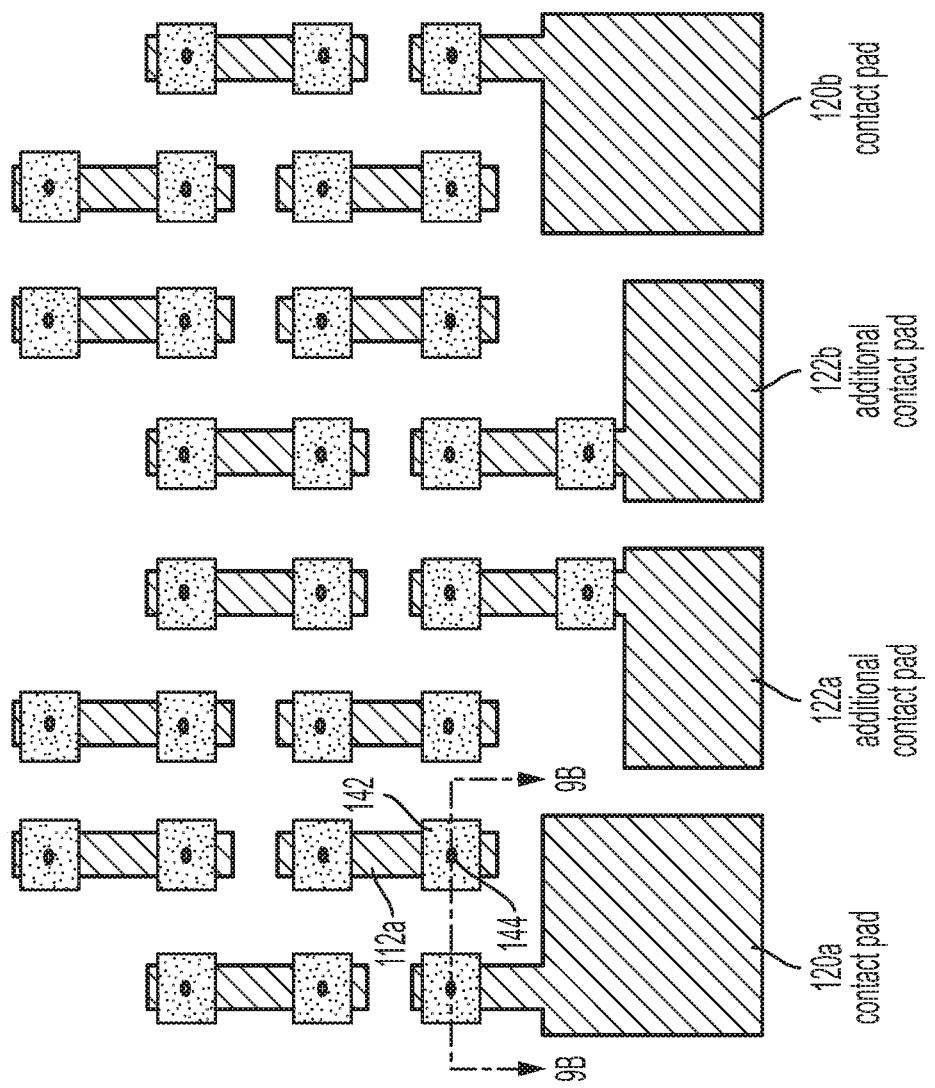
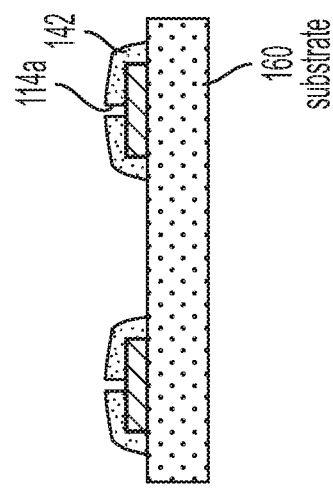
FIG. 9A
FIG. 9B

METHODS AND STRUCTURE TO PROBE THE METAL-METAL INTERFACE FOR SUPERCONDUCTING CIRCUITS

BACKGROUND

The currently claimed embodiments of the present invention relate to a method of probing a metal-metal interface, and corresponding structure.

Quantum circuits are often used for performing quantum computing operations. Surfaces and interfaces are important for achieving low loss resistance in superconducting quantum circuits. One important interface is between two conductors (superconducting or not) in a quantum circuit. Poor contact at the interface between the two conductors can reduce the coherence of the quantum circuit, or circuit components. To achieve good contacts for superconducting quantum circuits, for example, in-situ ion mill cleaning before junction evaporation is used to achieve high quality factor in superconducting qubits.

A way to measure the contact resistance of contacting conductors would be desirable.

SUMMARY

An aspect of the present invention is to provide a method of measuring contact resistance at an interface for electronic circuits. The method includes providing a chain structure of conducting elements, the conducting elements arranged in series to contact adjacent conducting elements at respective contacts having respective contact resistances; measuring a serial resistance of the chain structure at cryogenic temperatures; and determining a contact resistance based on the measured serial resistance.

Another aspect of the present invention is to provide a method of measuring contact resistance at an interface for superconducting circuits. The method includes using a chain structure of superconductors to measure a contact resistance at a contact between contacting superconductors. The method further includes eliminating ohmic resistance from wire lengths in the chain structure by operating below the lowest superconducting transition temperature of all the superconductors in the chain structure. The measurement is dominated by contact resistances of the contacts between contacting superconductors in the chain.

In an embodiment, the superconductors of the chain structure of superconductors are made of a first superconducting material and a second superconducting material different from the first superconducting material. In an embodiment, the superconductors of the chain structure of superconductors are alternately arranged between superconductors of the first superconducting material and superconductors of the second superconducting material.

A further aspect of the present invention is to provide a method of measuring contact resistance at an interface for superconducting circuits. The method includes providing a chain structure of superconducting elements, the superconducting elements arranged in series to contact adjacent superconducting elements at respective contacts having respective contact resistances; operating the chain structure such that all of the superconducting elements are in a superconducting state; and measuring a serial resistance of the chain structure while all of the superconducting elements are in a superconducting state.

In an embodiment, a number of contacts in the chain structure depends on the resistance per contact and the measurement noise. In an embodiment, the operating of the chain structure such that all of the superconducting elements are in a superconducting state includes cooling the chain structure to a temperature below a superconducting transition temperature of all of the superconducting elements.

In an embodiment, the superconducting elements of the chain structure of superconducting elements are made of a first superconducting material and a second superconducting material different from the first superconducting material. In an embodiment, the superconducting elements of the chain structure of superconductors are alternately arranged between superconducting elements of the first superconducting material and superconducting elements of the second superconducting material. In an embodiment, the superconducting elements of the chain structure are shaped as wires. In an embodiment, the number of superconducting elements of the chain structure is more than 100, for example, more than 10000 or more than 1000000.

Another aspect of the present invention is to provide a contact resistance measuring device. The device includes a chain structure of superconducting elements, the superconducting elements arranged in series to contact adjacent superconducting elements at respective contacts having respective contact resistances. The device further includes a serial resistance measuring device arranged to measure a serial resistance of the chain structure while all of the superconducting elements in the chain structure are in a superconducting state.

In an embodiment, the device further includes a cryostat arranged to cool the chain structure such that all of the superconducting elements are in a superconducting state. In an embodiment, the chain structure further includes a first conduction pad electrically connected to a first of the superconducting elements arranged in series and a last conduction pad electrically connected to a last of the superconducting elements arranged in series. In an embodiment, the chain structure further includes a first intermediate conduction pad electrically connected to a first intermediate of the superconducting elements arranged in series and a second intermediate conduction pad electrically connected to a second intermediate of the superconducting elements arranged in series. In an embodiment, the first intermediate conduction pad and the second intermediate conduction pad are adjacent to each other.

In an embodiment, the superconducting elements are arranged in a first group and a second group. In an embodiment, each superconducting element of the first group contacts at least one superconducting element of the second group. In an embodiment, the superconducting elements of the first group are alternately arranged with superconducting elements of the second group. In an embodiment, the superconducting elements of at least one of the first group or the second group are all of a same length. In an embodiment, the superconducting elements of the first group are arranged in a direction perpendicular to a direction the superconducting elements of the second group are arranged. In an embodiment, the superconducting elements of the first group and the superconducting elements of the second group are shaped as wires, each wire having a first wire width of a first portion of the wire and a contact wire width of a second portion of the wire, the second portion of the wire contacting an adjacent wire. In an embodiment, the first wire width is greater than the contact wire width for at least one of the first group or the second group.

In an embodiment, the device further includes a dielectric material arranged between the superconducting elements of the first group and the superconducting elements of the second group, the first group of superconducting elements contacting the second group of superconducting elements through respective holes in the dielectric material.

The term "perpendicular" is used herein broadly to mean substantially perpendicular wherein the angle is approximately 90 deg., for example an angle of 90 deg.±2 deg. (i.e., an angle between 88 deg. and 92 deg.).

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIG. 7A is a top view structure illustrating steps in a method of fabricating the chain structure of FIGS. 6A and 6B, according to some embodiments of the present invention;

FIG. 7B is a side cross-sectional view of a portion of the structure of FIG. 7A, according to some embodiments of the present invention;

FIG. 9A is a top view structure illustrating steps in a method of fabricating the chain structure of FIGS. 6A and 6B, according to some embodiments of the present invention;

FIG. 9B is a side cross-sectional view of a portion of the structure of FIG. 9A, according to some embodiments of the present invention.

DETAILED DESCRIPTION

Contact resistance is one measure of the quality of an interface between two conductors. According to some embodiments, a sufficiently long chain of serial contacts between conducting elements, such as conductors and/or superconductors, allows the measurement of the average resistance between the conducting elements, even if the resistance of a single contact is very low. In the superconducting state, the ohmic resistance of the wires in the chains vanishes, leaving only the contribution of the contacts to the resistance of the chain. The superconducting state of a superconductor is achieved by cooling it below its superconducting transition temperature $T_c$ and keeping external magnetic field as well as the magnitude of the applied current low. Operating in the superconducting regime eliminates all issues related to transfer length of the wiring elements, as the chain is always in the short contact limit. As a result, the small contact limit is always achieved independently of the contact area when using superconducting materials and cooling the chain structure below $T_c$, while keeping external magnetic field as well as the magnitude of the applied current low.

It should be understood herein that when we refer to contact resistance, we are considering both the real part and imaginary part of the contact impedance. The structures described herein are tested both using direct current (DC) and alternative current (AC) measurements. These measurements lead to information on the variation of resistance, capacitance and inductance of the structures with varying interface process conditions.

Figure 1:
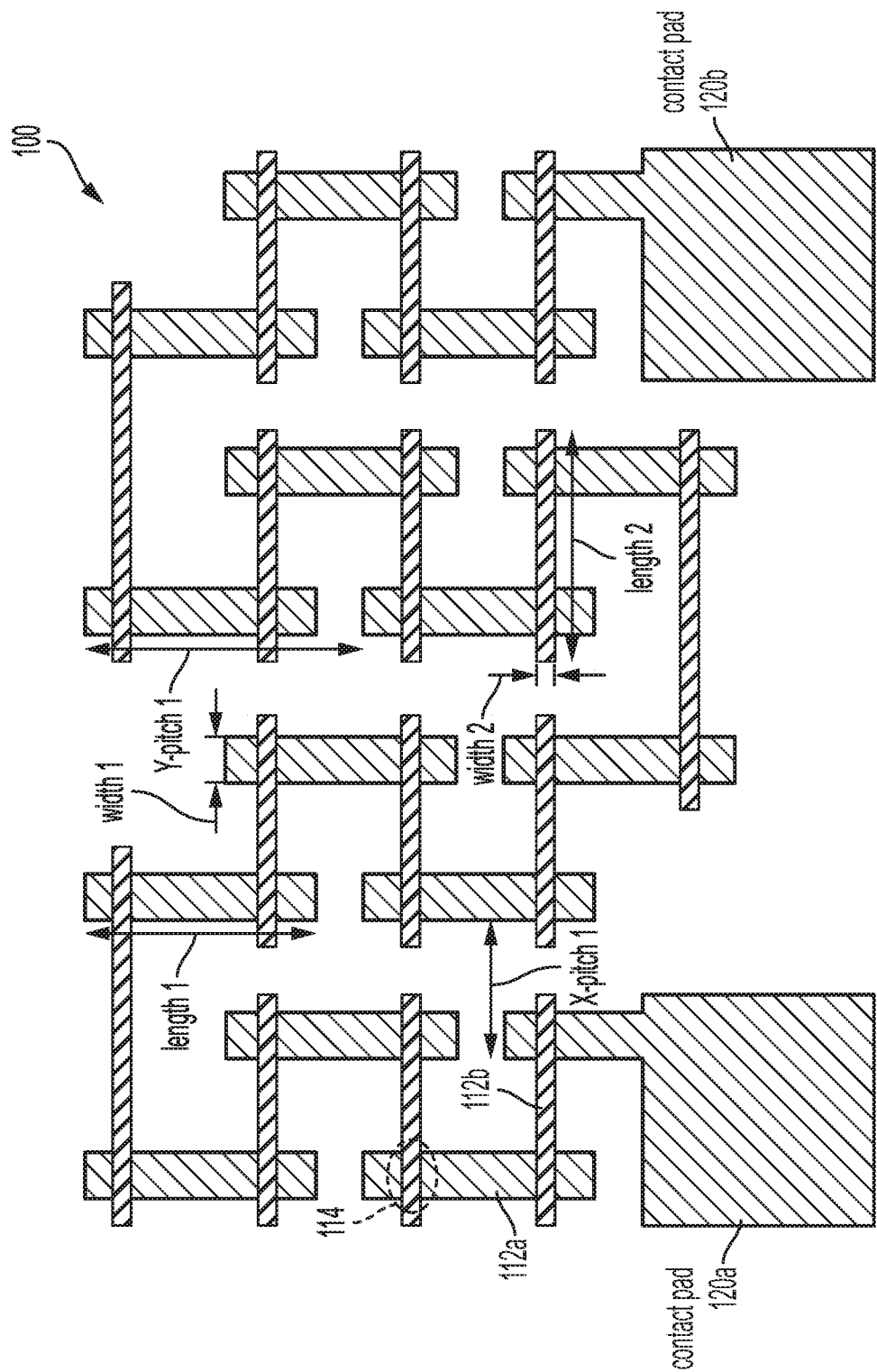
FIG. 1 is a schematic of a chain structure, according to some embodiments of the present invention.

FIG. 1 is a schematic of some embodiments illustrating a chain structure 100 of first conducting elements 112a and second conducting elements 112b, alternately arranged in series where the first conducting elements 112a contact adjacent of the second conducting elements 112b at the contacts 114. The first conducting elements 112a cross the second conducting elements 112b and physically contact the second conducting elements 112b. While FIG. 1 illustrates the number of conducting elements 112a and 112b to be relatively small, in general the number of conducting elements 112a and 112b may be much larger, such as greater than 100, or greater than 1,000,000, for example.

The conducting elements 112a and 112b may cross each other, maintaining the size (area) of the overlap contact 114, even under slight misalignment. The conducting elements 112a and 112b may be perpendicular to each other. Although the conducting elements 112a and 112b are shown being substantially perpendicular to each other (with an angle of 90 deg.±2 deg.), it is also contemplated to provide conducting elements 112a and 112b not perpendicular to each other, oriented relative to each other at an angle different from 90 deg. (for example, 45 deg. or other angle). The conducting elements 112a and 112b as shown in FIG. 1 may cross each other so as to provide a contact 114 having an area of width1 times width2, where width1 is the width of the first conducting elements 112a and width2 is the width of the second conducting elements 112b. The conducting elements 112a and 112b may be made of a superconducting or non-superconducting material. The conducting elements 112a and 112b may have a wire shape.

The first conducting elements 112a form a first group of conducting elements, while the second conducting elements 112b form a second group of conducting elements. Each of the first conducting elements 112a and the second conducting elements 112b may be made of a superconducting material. The superconducting materials may be the same or may be different. While FIG. 1 illustrates two groups of conducting elements, the number of groups of conducting elements may be more than two groups, and the material of the conducting elements for each of the groups may be different for each group.

The chain structure 100 may further include a first contact pad 120a electrically connected to a first of the conducting elements 112a arranged in series and a last contact pad 120b electrically connected to a last of the conducting elements 112a arranged in series. In operation, one resistance probe contacts the first contact pad 120a, and another resistance probe contacts the last contact pad 120b.

The method of measuring the contact resistance at an interface for electronic or quantum circuits may, according to some embodiments, use a provided chain structure, such as the chain structure 100 of FIG. 1. According to some embodiments, the chain structure of conducting elements 112a and 112b are arranged in series to contact adjacent conducting elements at respective contacts having respective contact resistances. A serial resistance of the chain structure 100 at cryogenic temperatures is then measured.

According to some embodiments, where the conducting elements are superconductors, a method of measuring contact resistance is provided. A chain structure of superconductors is used to measure a contact resistance at a contact between contacting superconductors. Ohmic resistance is eliminated from wire lengths of the conducting elements in the chain structure by operating below the lowest superconducting transition temperature of all the superconductors in the chain structure, wherein the measurement is dominated by contact resistances of the contacts in the chain.

According to some embodiments, a method of measuring contact resistance at an interface for superconducting circuits is provided. A chain structure of superconducting elements is provided, where the superconducting elements are arranged in series to contact adjacent superconducting elements at respective contacts having respective contact resistances. The chain structure is operated such that all of the superconducting elements are in a superconducting state, and a serial resistance of the chain structure is measured while all of the superconducting elements are in a superconducting state.

According to some embodiments, the measurement of contact resistance between two conducting elements 112a and 112b is described. The following assumptions are taken for the measurement: the conducting elements are superconducting elements, the measurement is performed such that the conducting elements are below the superconducting transition temperature, the chain of contacts contains about 1,000,000 conducting elements in series, the contact area is about 100×100 nm$^2$, and the intrinsic contact resistance is given as $\rho_c$. The resistance probed for a contact becomes:

$$R = (\text{number of contacts}) \times \rho_c / \text{contact area} = 10^{16} \text{ cm}^{-2} \times \rho_c.$$

For a measured resistance of 0.001 Ohm, the achievable intrinsic contact resistance $\rho_c$ becomes $10^{-19}$ $\Omega\text{cm}^2$. By comparison, a very good metal/metal contact in the current 5 nm semiconductor technologies would be about $10^{-12}$ $\Omega\text{cm}^2$. The best metal/semiconductor contact reaches approximately $3\times10^{-10}$ $\Omega\text{cm}^2$. Because the metal does not show any resistance below Tc, without pushing the limits on the number of contacts or the area of the contacts, we can achieve a resolution that is about 10 orders of magnitude better than the one achieved with advanced test sites for the measurement of metal/semiconductor interfaces in advanced CMOS technologies. The large difference originates from metal behavior (superconducting vs. not superconducting) in the two different technologies.

Figure 2:
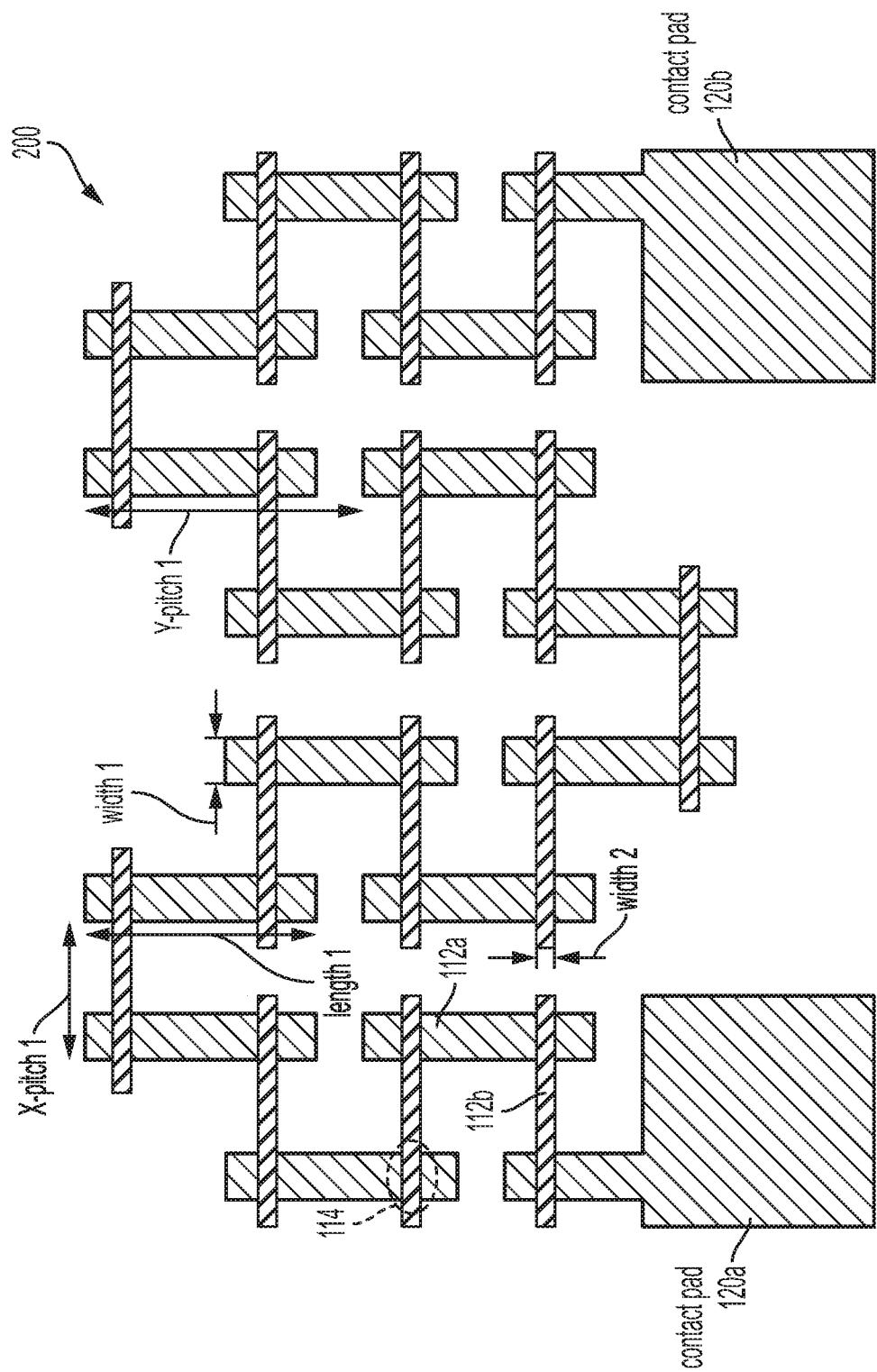
FIG. 2 is a schematic of a chain structure, according to some embodiments of the present invention.

FIG. 2 is a schematic of a chain structure 200, according to some embodiments of the present invention. The chain structure 200 includes first conducting elements 112a and second conducting elements 112b, alternately arranged in series where the first conducting elements 112a contact and intersect adjacent of the second conducting elements 112b at the contacts 114. The first conducting elements 112a cross the second conducting elements 112b and physically contact the second conducting elements 112b.

In the chain structure 200 of FIG. 2, the second conducting elements 112b are all of a uniform length. Each contact 114 has an area of width1 times width2, where width1 is the width of the first conducting elements 112a and width2 is the width of the second conducting elements 112b.

In general, the area of the contact between the two conducting elements can be calculated based on the chain structure layout and the fabrication process. For example, for a buried first conducting element, whose top surface is flush with or below the top surface of the substrate (now shown), the contact area=(contact width1)×(contact width2). For a first conducting element on top of the substrate, whose bottom surface is flush with the surface of the substrate, the contact area=(contact width1+2×thickness of conductor 1)×(contact width2).

Figure 3:
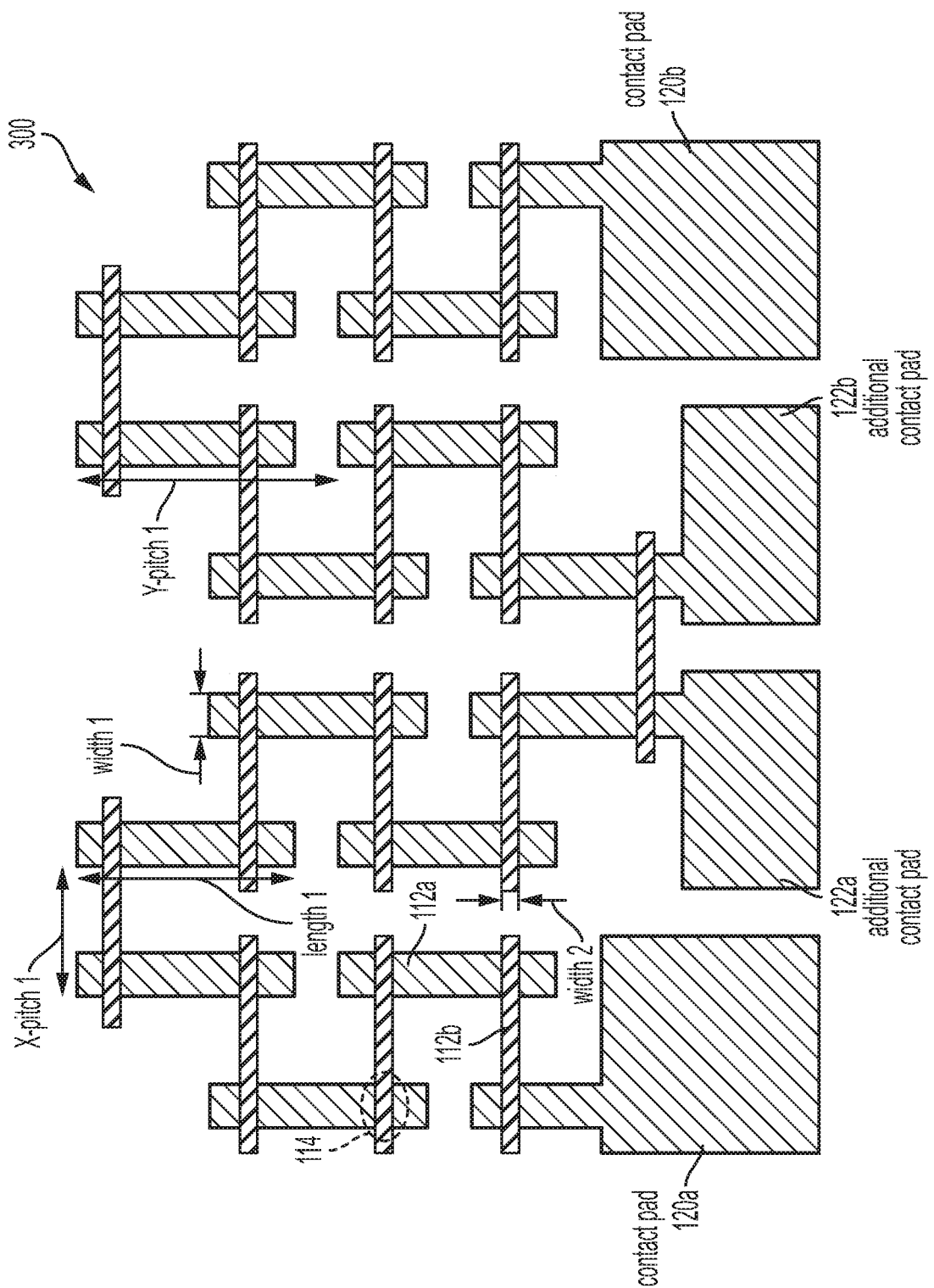
FIG. 3 is a schematic of a chain structure, according to some embodiments of the present invention.

FIG. 3 is a schematic of a chain structure 300 according to some embodiments. The chain structure 300 includes first conducting elements 112a and second conducting elements 112b, alternately arranged in series where the first conducting elements 112a contact adjacent of the second conducting elements 112b at the contacts 114. The first conducting elements 112a cross the second conducting elements 112b and physically contact the second conducting elements 112b.

In the chain structure 300 of FIG. 3, the second conducting elements 112b are all of a uniform length. Each contact 114 has an area of width1 times width2, where width1 is the width of the first conducting elements 112a and width2 is the width of the second conducting elements 112b.

According to some embodiments, the chain structure 300 of FIG. 3 includes a first contact pad 120a electrically connected to a first of the conducting elements 112a arranged in series, and a last contact pad 120b electrically connected to a last of the conducting elements 112a arranged in series. Additionally, the chain structure 300 further includes a first intermediate conduction pad 122a electrically connected to a first intermediate of the conducting elements 112A arranged in series, and a second intermediate conduction pad 122b electrically connected to a second intermediate of the superconducting elements 112b arranged in series. In operation, one resistance probe contacts the first contact pad 120a, and another resistance probe contacts the first intermediate conduction pad 122a, or one resistance probe contacts the second contact pad 120b, and another resistance probe contacts the second intermediate conduction pad 122b. In this way only a portion of the chain of conducting elements 112a and 112b is probed at one time. The number of elements in each portion of the chain may be the same or may be different from each other. The multiple contact pads that access the chain at intermediate locations allow for the measurement of resistance for different chain lengths and allow for checking scaling behavior.

As shown in FIG. 3, the superconducting elements 112a and 112b are arranged in a first group and a second group. Each superconducting element 112a of the first group contacts at least one superconducting element 112b of the second group. The superconducting elements 112a of the first group are alternately arranged with superconducting elements 112b of the second group. The superconducting elements 112a, 112b of at least one of the first group or the second group are all of a same length. The superconducting elements 112a of the first group are arranged in a direction perpendicular to a direction the superconducting elements 112b of the second group are arranged. The superconducting elements 112a of the first group and the superconducting elements 112b of the second group are shaped as wires, each wire having a first wire width of a first portion of the wire and a contact wire width of a second portion of the wire, the second portion of the wire contacting an adjacent wire.

Figure 4:
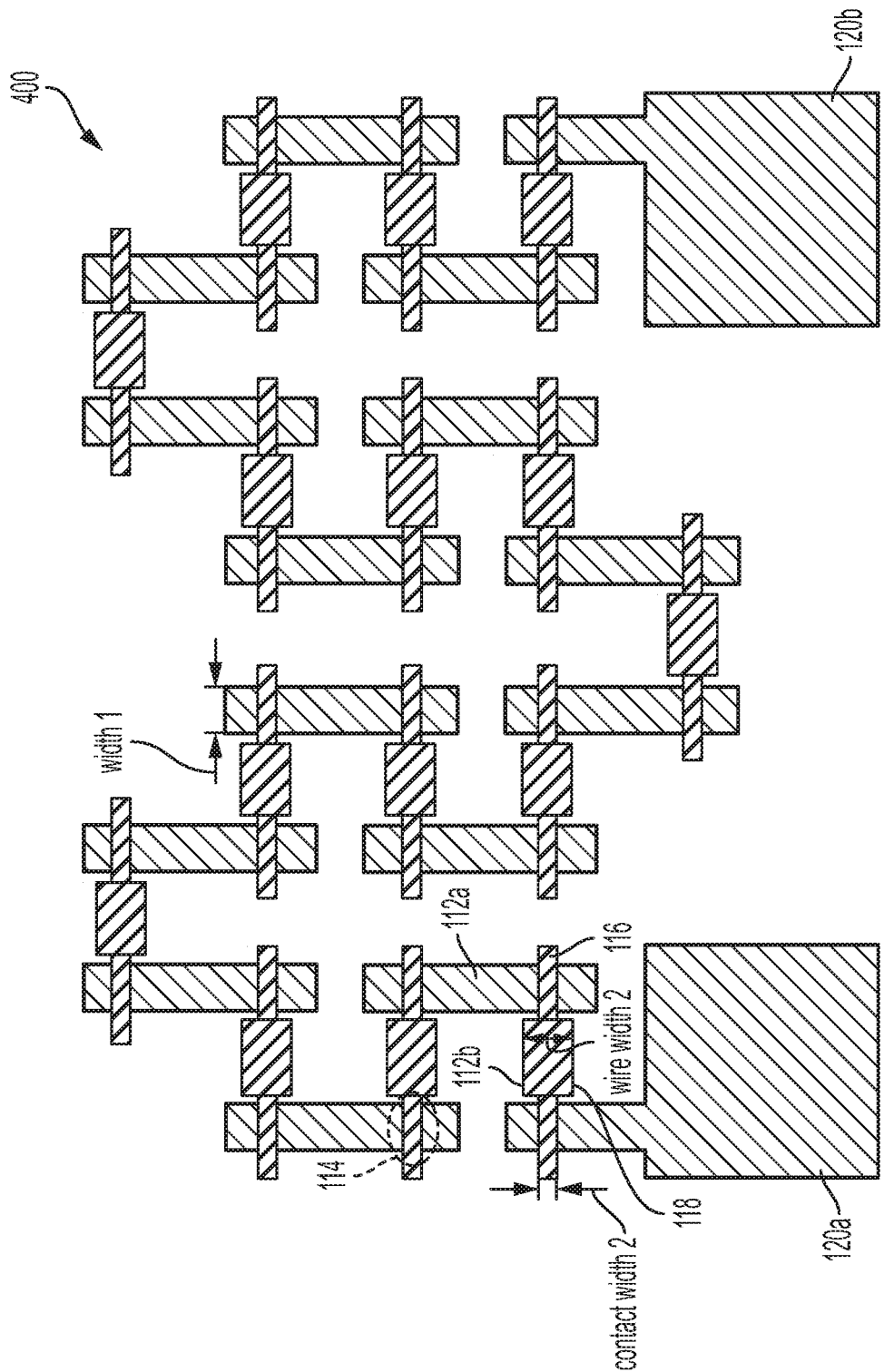
FIG. 4 is a schematic of a chain structure, according to some embodiments of the present invention.

FIG. 4 is a schematic of a chain structure 400, according to some embodiments of the present invention. The chain structure 400 includes first conducting elements 112a and second conducting elements 112b, alternately arranged in series where the first conducting elements 112a contact adjacent of the second conducting elements 112b at the contacts 114. The first conducting elements 112a cross the second conducting elements 112b and physically contact the second conducting elements 112b. The first conducting elements 112a and the second conducting elements 112b are shaped as wires.

In the chain structure 400 of FIG. 4, the second conducting elements 112b each have a first wire width of a first portion 116 of the wire and a contact wire width of a second portion 118 of the wire, where the second portion 118 of the wire contacts an adjacent wire. The contact wire width of the second portion 118 may be smaller than the first wire width of the first portion 116.

Generally, the layout of the chain structure can be modified by multiple geometric parameters, such as wire widths, wire lengths, and wire pitch. For example, the wire width in between contact points can be changed while keeping contact area constant.

Figure 5:
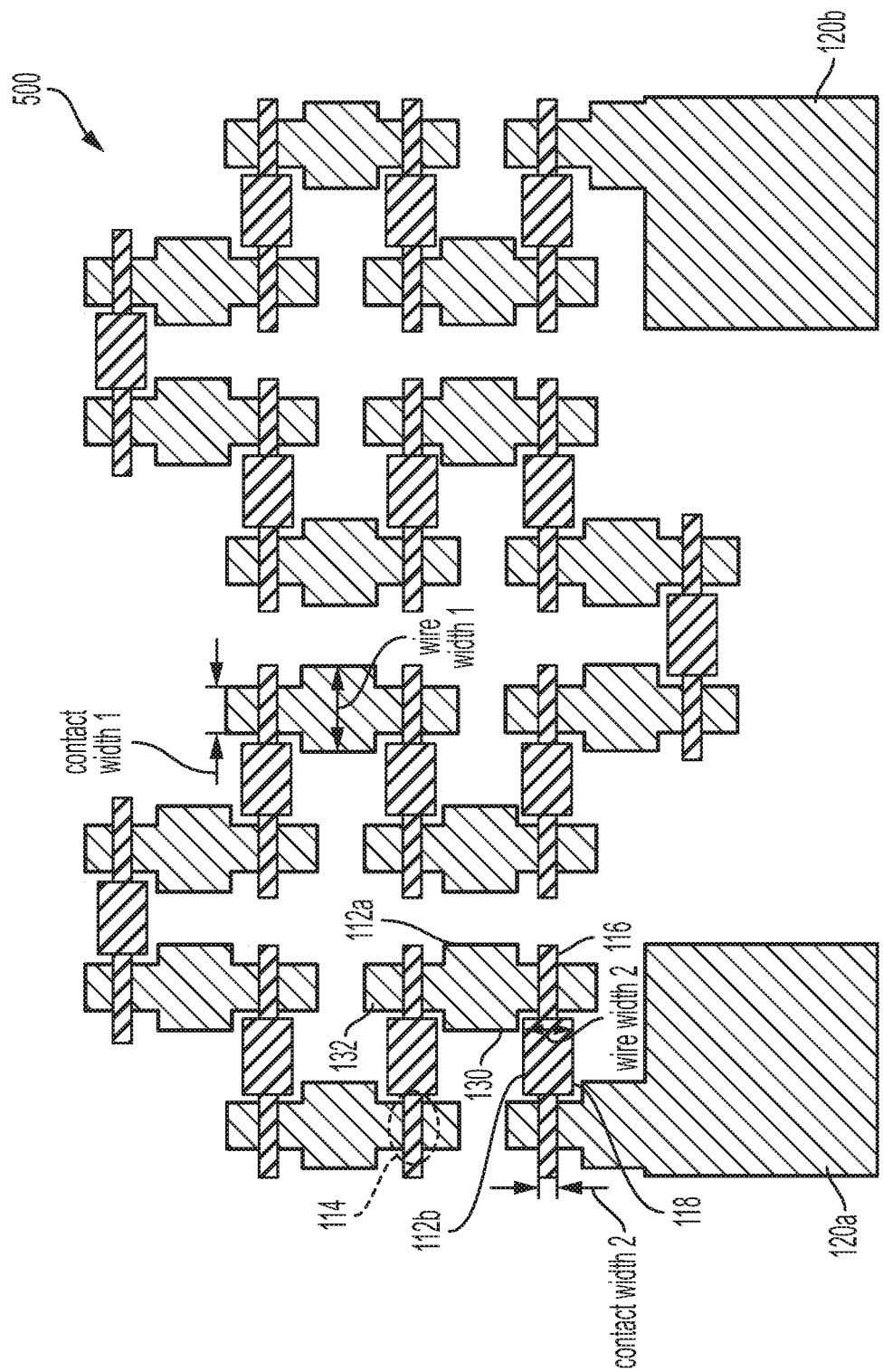
FIG. 5 is a schematic of a chain structure, according to some embodiments of the present invention.

The chain structure 500 of FIG. 5 is similar in many aspects to the chain structure 400 of FIG. 4. The chain structure 500 of FIG. 5, however, further has the feature where the first conducting elements 112a each have a wire width of a third portion 130 of the wire, and a contact wire width of a fourth portion 132 of the wire, where the fourth portion 132 of the wire contacts an adjacent wire. The contact wire width of the fourth portion 132 may be smaller than the wire width of the third portion 130.

Figure 6B:
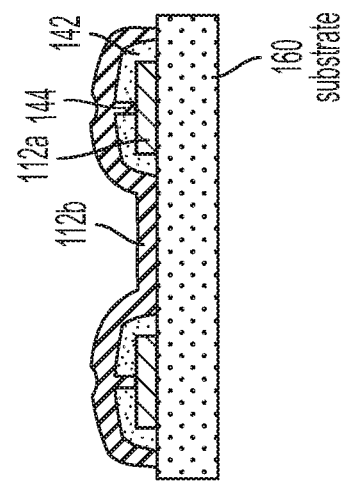
FIG. 6B is a side cross-sectional view of a portion of the chain structure of FIG. 6A, according to some embodiments of the present invention.
Figure 6A:
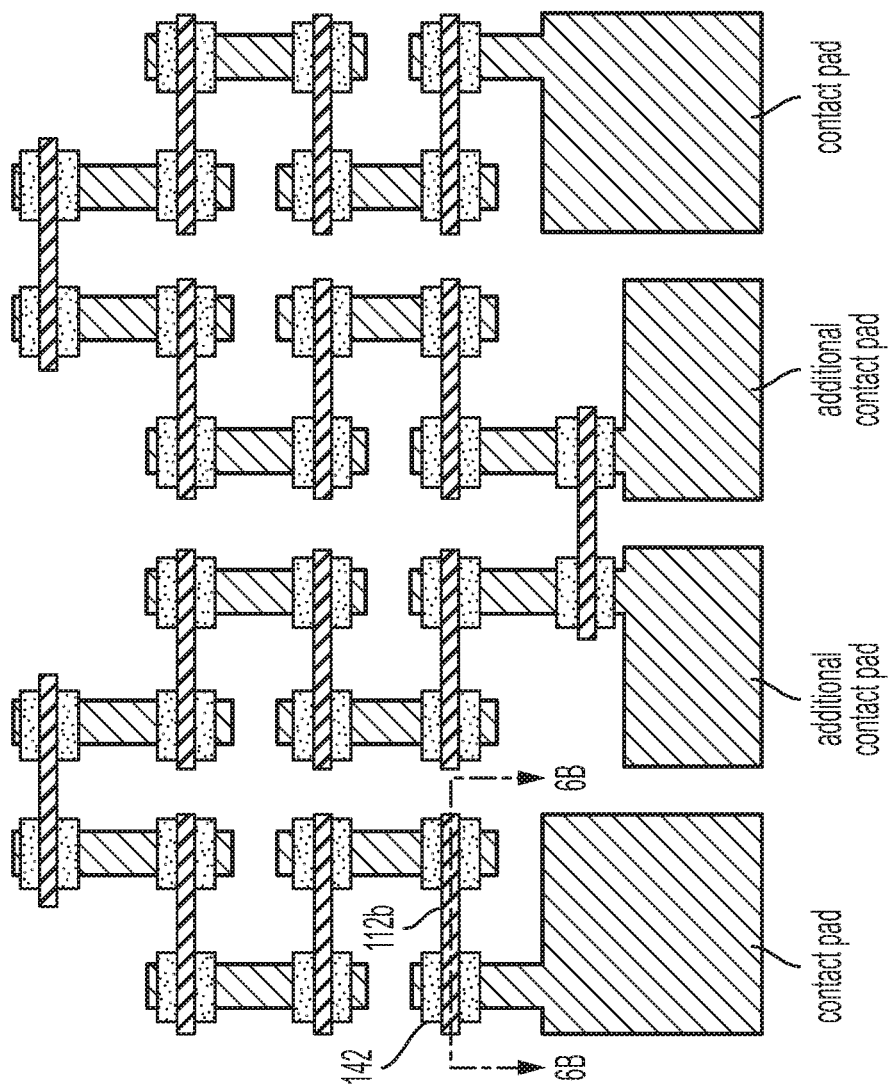
FIG. 6A is a schematic of a chain structure illustrating a top view, according to some embodiments of the present invention.

FIG. 6A is a schematic of a chain structure illustrating a top view, according to some embodiments of the present invention. FIG. 6B is a side cross-sectional view of a portion of the chain structure of FIG. 6A. The chain structure includes first conducting elements 112a and second conducting elements 112b, alternately arranged in series where the first conducting elements 112a contact adjacent of the second conducting elements 112b at the contacts 114. The first conducting elements 112a cross the second conducting elements 112b and physically contact the second conducting elements 112b.

Referring to FIGS. 6A and 6B, the chain structure further may include a dielectric material 142 arranged between the first conducting elements 112a and the second conducting elements 112b. The first conducting elements 112a contact the second conducting elements 112b through respective holes 144 in the dielectric material 142. The cross-section of the second conducting elements 112b perpendicular to the hole direction determines the size of the contact.

In some embodiments, as shown in FIGS. 6A and 6B, the dielectric material 142 is arranged between the superconducting elements 112a of the first group and the superconducting elements 112b of the second group. The first group of superconducting elements 112a contact the second group of superconducting elements 112b through the respective holes 144 in the dielectric material 142. In some embodiments, the dielectric material 142 fully covers the first superconducting elements (layer) 112a, and only contact holes 144 are opened in this layer 112a.

Figure 8B:
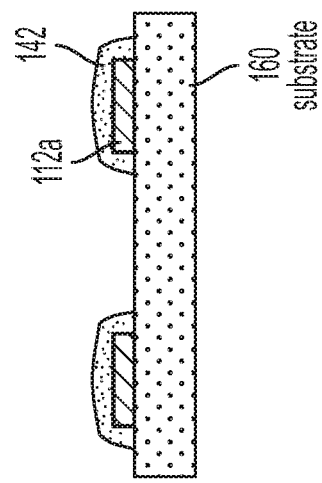
FIG. 8B is a side cross-sectional view of a portion of the structure of FIG. 8A, according to some embodiments of the present invention.
Figure 8A:
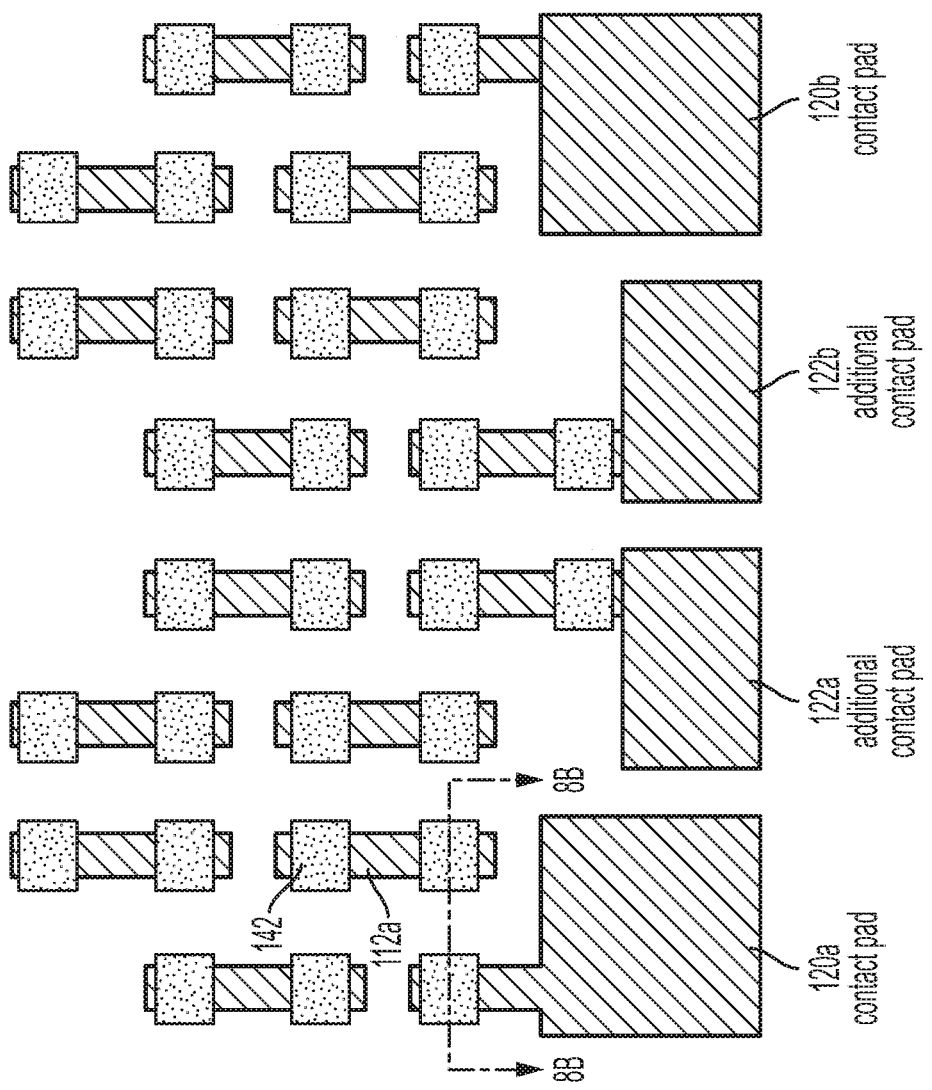
FIG. 8A is a top view structure illustrating steps in a method of fabricating the chain structure of FIGS. 6A and 6B, according to some embodiments of the present invention.

FIGS. 7A, 7B, 8A, 8B, 9A and 9B illustrate a method of fabricating the chain structure of FIGS. 6A and 6B, according to some embodiments of the present invention. FIG. 7A is a top view, and FIG. 7B is a side cross-sectional view of a portion of the structure of FIG. 7A. Similarly, FIG. 8A is a top view, and FIG. 8B is a side cross-sectional view of a portion of the structure of FIG. 8A. Similarly, FIG. 9A is a top view, and FIG. 9B is a side cross-sectional view of a portion of the structure of FIG. 9A.

Referring to FIGS. 7A and 7B, a conducting material is formed on substrate 160 and patterned to form the first conducting element 112a, the first contact pad 120a, the first intermediate contact pad 122a, the last contact pad 120b, and the second intermediate contact pad 122b. The substrate 160 may be formed of an insulating material, for example. The patterned first conducting element 112a, first contact pad 120a, first intermediate contact pad 122a, last contact pad 120b, and second intermediate contact pad 122b may be formed lithographically. For example, a photoresist may be formed on the conducting material, exposed through a photomask, and developed to form a desired patterned etch mask, followed by etching the conducting material through the patterned etch mask. The patterned etch mask may then be removed to provide the structure shown in FIGS. 7A and 7B.

Referring to FIGS. 8A and 8B, a dielectric layer 142 may be formed to cover the regions where the first conducting elements 112a overlaps the second conducting elements 112b (not shown in FIGS. 8A and 8B). For example, a dielectric material may be formed over the substrate 140, and patterned, such as by a lithographic method. The resulting dielectric layer 142 cover the regions where the first conducting elements 112a overlap the to be formed second conducting elements 112b (not shown in FIGS. 8A and 8B).

Referring to FIGS. 9A and 9B, a hole 144 is formed in the dielectric layer 142 between the overlapping first conducting elements 112a and the to be formed second conducting elements 112a. For example, the hole 144 may be formed photolithographically by forming a patterned photoresist to act as an etch mask, followed by etching the dielectric layer 142 through the etch mask. For example, the hole 144 may be formed by an anisotropic etch, such as by a reactive ion etch (RIP.

Referring to FIGS. 6A and 6B, the first conducting elements 112a are formed to contact respective of the second conducting elements 112b through the holes 144 in the dielectric layer 142. For example, a conducting material is deposited such that it covers the substrate 140 and enters into the holes 144 contacting the first conducting elements 112a. The conducting material may then be patterned, such as by lithographic methods, to form the second conducting elements 112b, which contact the first conducting elements 112a through the holes 144 in the dielectric layer 142. We note here that the dielectric layer could be continuous and covering the substrate so that only contact holes 144 are fabricated in a uniform and conformal layer. In this case, the second conducting element 112b is deposited on the dielectric, contact the first conducting elements 112a through the holes 144 and is not in contact with the substrate.

Figure 10:
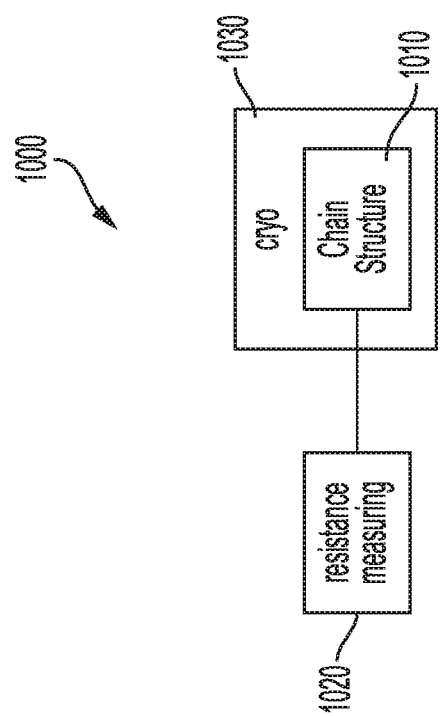
FIG. 10 is a schematic illustrating a contact resistance measuring device, according to some embodiments of the present invention.

FIG. 10 is a schematic illustrating a contact resistance measuring device 1000 according to some embodiments. The contact resistance measuring device 1000 includes a chain structure 1010 of conducting elements, such as any of chain structures described above. The conducting elements may be superconducting elements, for example. The conducting elements may be arranged in series to contact adjacent of the conducting elements at respective contacts having respective contact resistances. The contact resistance measuring device 1000 further includes a serial resistance measuring device 1020 arranged to measure a serial resistance of the chain structure while all of the conducting elements are in a superconducting state. The serial resistance measuring device 1020 may include a resistance meter, for example.

The contact resistance measuring device 1000 may further include a cryostat 1030 arranged to cool the chain structure such that all of the superconducting elements in the chain structure 1010 are in a superconducting state.

Various modifications according to various embodiments are contemplated and envisioned. For example, number of contacts may be varied as needed in the contact chain 1010. For low contact resistance between two superconductors, the chain length can be increased appropriately to measure the average contact resistance in the chain. Given an expected contact resistance per contact, and the noise level of the measurement instrument, the number of contacts required in the chain can be calculated.

The contact area can be reduced, and thus the resistance per contact can be increased, by using a dielectric layer between the first conducting elements and the second conducting elements with a small opening in the dielectric layer, such as in some embodiments as shown in FIGS. 6A and 6B. For example, electron beam lithography with HSQ resist could be used to define a small opening. The inorganic (silicon oxide-like) resist can function as a dielectric layer. Alternatively, a small opening can be lithographically patterned in a dielectric/hard mask film.

The descriptions of the various embodiments have been presented for the purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of measuring contact resistance at an interface for electronic circuits comprising:
   providing a chain structure of conducting elements, the conducting elements arranged in series to contact adjacent conducting elements at respective contacts having respective contact resistances;
   measuring a serial resistance of the chain structure at cryogenic temperatures; and
   determining a contact resistance of the respective contacts between the conducting elements based on the measured serial resistance.

2. A method of measuring contact resistance at an interface for superconducting circuits comprising:
   providing a chain structure of superconductors to measure a contact resistance at a contact between contacting superconductors;
   eliminating ohmic resistance from wire lengths in the chain structure by operating below a lowest superconducting transition temperature of all the superconductors in the chain structure;
   measuring a serial resistance of the chain structure; and
   determining the contact resistance of the contact between the contacting superconductors based on the measured serial resistance of the chain structure,
   wherein the measurement is dominated by contact resistances of the contacts between the contacting superconductors in the chain structure.

3. The method of claim 2, wherein the superconductors of the chain structure of superconductors are made of a first superconducting material and a second superconducting material different from the first superconducting material.

4. The method of claim 3, wherein the superconductors of the chain structure of superconductors are alternately arranged between superconductors of the first superconducting material and superconductors of the second superconducting material.

5. The method of claim 2, wherein the contacting superconductors of the chain structure are shaped as wires.

6. A method of measuring contact resistance at an interface for superconducting circuits comprising:
   providing a chain structure of superconducting elements, the superconducting elements arranged in series to contact adjacent superconducting elements at respective contacts having respective contact resistances;
   operating the chain structure such that all of the superconducting elements are in a superconducting state; and
   measuring a serial resistance of the chain structure while all of the superconducting elements are in a superconducting state; and
   determining the contact resistance of the contacts between the contacting superconductors based on the measured serial resistance of the chain structure.

7. The method of claim 6, further comprising calculating a number of contacts in the chain structure based on a resistance per contact and a noise level of a measurement instrument measuring the serial resistance.

8. The method of claim 6, wherein the operating of the chain structure such that all of the superconducting elements are in a superconducting state comprises cooling the chain structure to a temperature below a superconducting transition temperature of all of the superconducting elements.

9. The method of claim 6, wherein the superconducting elements of the chain structure of superconducting elements are made of a first superconducting material and a second superconducting material different from the first superconducting material.

10. The method of claim 9, wherein the superconducting elements of the chain structure of superconducting elements are alternately arranged between superconducting elements of the first superconducting material and superconducting elements of the second superconducting material.

11. The method of claim 6, wherein the superconducting elements of the chain structure are shaped as wires.

12. The method of claim 6, wherein the number of superconducting elements of the chain structure is more than 10000.

13. A contact resistance measuring device comprising:
   a chain structure of superconducting elements, the superconducting elements arranged in series to contact adjacent superconducting elements at respective contacts having respective contact resistances; and
   a serial resistance measuring device arranged to measure a serial resistance of the chain structure while all of the superconducting elements in the chain structure are in a superconducting state,
   wherein the serial resistance measuring device is configured to provide a contact resistance of contacts between the superconducting elements based on the measured serial resistance of the chain structure.

14. The contact resistance measuring device of claim 13, further comprising a cryostat arranged to cool the chain structure such that all of the superconducting elements are in a superconducting state.

15. The contact resistance measuring device of claim 13, wherein the chain structure further comprises a first conduction pad electrically connected to a first of the superconducting elements arranged in series and a last conduction pad electrically connected to a last of the superconducting elements arranged in series.

16. The contact resistance measuring device of claim 15, wherein the chain structure further includes a first intermediate conduction pad electrically connected to a first intermediate of the superconducting elements arranged in series and a second intermediate conduction pad electrically connected to a second intermediate of the superconducting elements arranged in series.

17. The contact resistance measuring device of claim 16, wherein the first intermediate conduction pad and the second intermediate conduction pad are adjacent to each other.

18. The contact resistance measuring device of claim 13, wherein the superconducting elements are arranged in a first group and a second group.

19. The contact resistance measuring device of claim 18, wherein each superconducting element of the first group contacts at least one superconducting element of the second group.

20. The contact resistance measuring device of claim 18, wherein the superconducting elements of the first group are alternately arranged with superconducting elements of the second group.

21. The contact resistance measuring device of claim 18, wherein the superconducting elements of at least one of the first group or the second group are all of a same length.

22. The contact resistance measuring device of claim 18, wherein the superconducting elements of the first group are arranged in a direction perpendicular to a direction the superconducting elements of the second group are arranged.

23. The contact resistance measuring device of claim 18, wherein the superconducting elements of the first group and the superconducting elements of the second group are shaped as wires, each wire having a first wire width of a first portion of the wire and a contact wire width of a second portion of the wire, the second portion of the wire contacting an adjacent wire.

24. The contact resistance measuring device of claim 23, wherein the first wire width is greater than the contact wire width for at least one of the first group or the second group.

25. The contact resistance measuring device of claim 18, further comprising a dielectric material arranged between the superconducting elements of the first group and the superconducting elements of the second group, the first group of superconducting elements contacting the second group of superconducting elements through respective holes in the dielectric material.

* * * * *